(12) United States Patent
Son et al.

(10) Patent No.: US 7,566,602 B2
(45) Date of Patent: Jul. 28, 2009

(54) METHODS OF FORMING SINGLE CRYSTALLINE LAYERS AND METHODS OF MANUFACTURING SEMICONDUCTOR DEVICES HAVING SUCH LAYERS

(75) Inventors: Yong-Hoon Son, Gyeonggi-do (KR); Si-Young Choi, Gyeonggi-do (KR); Jong-Wook Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 252 days.

(21) Appl. No.: 11/751,857

(22) Filed: May 22, 2007

(65) Prior Publication Data

US 2007/0218607 A1 Sep. 20, 2007

Related U.S. Application Data

(63) Continuation-in-part of application No. 11/121,562, filed on May 4, 2005, now Pat. No. 7,364,955.

(30) Foreign Application Priority Data

| Jun. 12, 2004 | (KR) | ............... 10-2004-0043265 |
| Sep. 19, 2006 | (KR) | ............... 10-2006-0090837 |

(51) Int. Cl.
*H01L 21/84* (2006.01)
(52) U.S. Cl. ............... 438/166; 257/E21.561
(58) Field of Classification Search ......... 438/151–166; 257/E21.561
See application file for complete search history.

(56) References Cited

U.S. PATENT DOCUMENTS

| 4,489,478 | A | 12/1984 | Sakurai |
| 5,378,644 | A | 1/1995 | Morihara |
| 5,970,369 | A | 10/1999 | Hara et al. |
| 5,972,105 | A | 10/1999 | Yamazaki et al. ............ 117/8 |
| 6,391,695 | B1 | 5/2002 | Yu |
| 7,364,955 | B2 * | 4/2008 | Son et al. ............ 438/166 |

(Continued)

FOREIGN PATENT DOCUMENTS

JP 2001-044132 2/2001

(Continued)

OTHER PUBLICATIONS

Notice to Submit a Response to Korean Patent Application No. 10-2004-0043265 mailed on Nov. 30, 2005.

*Primary Examiner*—Richard A. Booth
(74) *Attorney, Agent, or Firm*—Myers Bigel Sibley & Sajovec

(57) ABSTRACT

In a method of forming a single crystalline semiconductor layer, an amorphous layer may be formed on a seed layer that includes a single crystalline material. The single crystalline layer may be formed from the amorphous layer by irradiating a laser beam onto the amorphous layer using the seed layer as a seed for a phase change of the amorphous layer. The laser beam may have an energy for melting the amorphous layer, and the laser beam may be irradiated onto the amorphous layer without generating a superimposedly irradiated region of the amorphous layer. The single crystalline layer may include a high density of large-sized grains without generating a protrusion thereon through a simple process so that a semiconductor device including the single crystalline layer may have a high degree of integration and improved electrical characteristics.

24 Claims, 16 Drawing Sheets

U.S. PATENT DOCUMENTS

2005/0202654 A1 9/2005 Im
2005/0233508 A1 10/2005 Ushiku

FOREIGN PATENT DOCUMENTS

| | | |
|---|---|---|
| JP | 2001308008 | 11/2001 |
| JP | 2002359195 | 12/2005 |
| KR | 1020030007093 A | 1/2003 |
| KR | 10-0379859 | 3/2003 |
| KR | 1020040040762 | 5/2004 |
| KR | 10-0496139 | 6/2005 |
| KR | 10-0578787 | 5/2006 |

* cited by examiner

METHODS OF FORMING SINGLE CRYSTALLINE LAYERS AND METHODS OF MANUFACTURING SEMICONDUCTOR DEVICES HAVING SUCH LAYERS

CROSS-REFERENCE TO RELATED APPLICATIONS

This application claims priority as a continuation-in-part of U.S. patent application Ser. No. 11/121,562 filed on May 4, 2005, now U.S.Pat. No.7,364,955which in turn claims priority under 35 U.S.C. § 119 to Korean Patent Application No. 2004-43265, filed Jun. 12, 2004. This application also claims priority under 35 USC § 119 to Korean Patent Application No. 2006-90837 filed on Sep. 19, 2006. The contents of each of the above-referenced applications are hereby incorporated herein by references as if set forth in their entireties.

FIELD OF THE INVENTION

The present invention relates to methods of forming single crystalline layers and, more particularly, to methods of forming single crystalline layers that include a high density of large-sized grains and related methods of manufacturing semiconductor devices having such single crystalline layers.

BACKGROUND OF THE INVENTION

The crystalline structure of a material is typically classified into one (or more) of three categories, namely single crystalline materials, polycrystalline materials and amorphous materials. Single crystalline materials refer to materials that have a single crystal unit structure, while polycrystalline materials are materials that include a plurality of crystal units. Amorphous materials generally do not have a defined crystal structure as atoms in the amorphous material may be irregularly bonded to each other. Herein a material or layer is referred to as a "non-single crystalline" material or layer if the material or layer is not a single crystalline layer (i.e., it is a polycrystalline and/or amorphous material or layer). Polycrystalline materials typically have a large number of grain boundaries (i.e., the interface between two or more of the plurality of crystal units). These grain boundaries may restrict the movement of carriers such as electrons or holes through polycrystalline materials. To reduce and/or to minimize such reductions in carrier mobility, single crystalline silicon layers are often used, for example, as an active region of a system-on-chip (SOC) device or an active region of a thin film transistor (TFT) having a stacked structure.

A single crystalline silicon layer is one that includes a high density of relatively large single crystal grains. It will be appreciated by those of skill in the art that polycrystalline layers may also have a plurality a single crystal units contained therein, but the size of the grains and the density of large grains is substantially smaller. Generally, a layer is considered to comprise a single crystalline semiconductor layer as opposed to a polycrystalline (or other) layer when the layer contains a high density of single crystal grains that exhibit long-range translational symmetry.

As a single crystalline silicon layer includes a high density of relatively large single crystal grains, it will typically have far fewer grain boundaries than a polycrystalline silicon layer, and hence will exhibit improved carrier mobility. The present inventors have filed a patent application directed to methods of forming single crystalline silicon layers that include a high density of relatively large single crystal grains as Korean Patent Application No. 2004-43265 on Jun. 12, 2004. This patent application was registered as Korean Patent No. 578,787 on May 4, 2006.

According to the methods set forth in the above-identified Korean patent application, a non-single crystalline silicon film such as, for example, an amorphous silicon film is formed on a seed layer that includes single crystalline silicon, and then a laser beam is irradiated onto the amorphous silicon layer so as to change the amorphous silicon layer into the single crystalline silicon layer. The laser beam may be irradiated onto the amorphous silicon layer by, for example, a scanning process. However, when this method is used, sharp protrusions may be formed on the single crystalline silicon layer. FIGS. 1 and 2 are cross-sectional diagrams that illustrate the above-described method of forming a single crystalline silicon layer.

In particular, as shown in FIG. 1, sharp protrusions 112 may be formed on single crystalline silicon layer 100 because the single crystalline silicon layer 100 is formed by a scanning process. As shown in FIG. 2, a laser beam 122 is superimposedly irradiated onto portions II of an amorphous silicon layer 120 in the scanning process so that the protrusions 112 may be formed on the single crystalline silicon layer 100. By "superimposedly irradiated" it is meant that the laser beam melts portions of the layer more than once. When the laser beam 122 is superimposedly irradiated onto the portions II of the amorphous silicon layer 120, the portions II of the amorphous silicon layer 120 are repeatedly melted allowing excessive growth from the seed layer, thereby forming the sharp protrusions 112 from the portions II of the amorphous silicon layer 120. The sharp protrusions 112 may adversely effect the performance of electronic devices grown on or in the single crystalline silicon layer 100.

SUMMARY

Pursuant to some embodiments of the present invention, methods of forming single crystalline semiconductor layers are provided in which a seed layer that includes a single crystalline semiconductor material is formed. A non-single crystalline layer is formed on the seed layer. Then, the non-single crystalline layer is transformed into the single crystalline semiconductor layer by irradiating a laser beam onto the non-single crystalline layer such that an energy of the laser beam is sufficient to melt at least portions of the non-single crystalline layer. The laser beam is irradiated onto the non-single crystalline layer without generating a superimposedly irradiated region of the non-single crystalline layer.

In these methods, the transformation may occur during a phase change of the non-single crystalline layer. Moreover, the seed layer may act as a seed for the crystallization of the non-single crystalline layer. The single crystalline semiconductor material in the seed layer may include, for example, single crystalline silicon, single crystalline germanium or single crystalline silicon germanium. In some embodiments, the non-single crystalline layer may be an amorphous layer. The amorphous layer may include, for example, amorphous silicon, amorphous germanium or amorphous silicon germanium. The single crystalline semiconductor layer may include, for example, single crystalline silicon, single crystalline germanium or single crystalline silicon germanium.

In some embodiments, a separate heating source may be used to heat the seed layer and the amorphous layer during at least part of the time during which the laser beam is irradiated onto the amorphous layer. This separate heating source may heat the layers at a temperature of about 200° C. to about 600° C. The laser beam may be irradiated onto the amorphous layer by a step-and-repetition process and/or may be separately irradiated onto each of a plurality of regions of the amorphous layer.

According to further embodiments of the present invention, methods of manufacturing semiconductor devices are provided. Pursuant to these methods, a first single crystalline layer may be formed on a substrate, and then a first insulation layer having an opening therein may be formed on the first single crystalline layer. A first seed layer may be formed to fill the opening, and then an amorphous layer may be formed on the first seed layer and the first insulation layer. A second single crystalline layer may be formed from the amorphous layer by irradiating a laser beam onto the amorphous layer using the first seed layer as a seed for a phase change of the amorphous layer. The laser beam may have an energy sufficient to melt the amorphous layer, and the laser beam may be irradiated onto the amorphous layer without generating a superimposedly irradiated region of the amorphous layer.

In some embodiments, the first insulation layer may include silicon oxide and the first single crystalline layer may include single crystalline silicon. The first seed layer may include single crystalline silicon, single crystalline germanium or single crystalline silicon germanium.

In some embodiments, a resulting structure on the substrate may be heated by a separate heating source while irradiating the laser beam onto the amorphous layer. For example, the resulting structure may be heated at a temperature of about 200° C. to about 600° C.

In some embodiments, the amorphous layer may include amorphous silicon, amorphous germanium or amorphous silicon germanium. Additionally, the second single crystalline layer may include single crystalline silicon, single crystalline germanium or single crystalline silicon germanium.

In some embodiments, the laser beam may be irradiated onto the amorphous layer by a step-and-repetition process. For example, the laser beam may be separately irradiated onto each of a plurality of regions of the amorphous layer.

In some embodiments, a semiconductor structure may be formed on the first single crystalline layer. In some embodiments, a portion of the first seed layer on the first insulation layer may be removed by a chemical mechanical polishing (CMP) process.

In some embodiments, the semiconductor device may include a second insulation layer to a k-th (k is an integer greater than 2) insulation layer, a second seed layer to an l-th (l is an integer greater than 2) seed layer, and a third single crystalline layer to an m-th (m is an integer greater than 3) single crystalline layer. The second to the k-th insulation layers may be substantially the same as the first insulation layer. The second to the l-th seed layers may be substantially the same as the first seed layer. The third to the m-th single crystalline layers may be substantially the same as the second single crystalline layer. The second to the k-th insulation layers, the second to the l-th seed layers, and the third to the m-th single crystalline layers may be alternately formed on the second single crystalline layer.

BRIEF DESCRIPTION OF THE DRAWINGS

The above and other features and advantages of the present invention will become more apparent by describing in detailed embodiments thereof with reference to the accompanying drawings, in which.

DESCRIPTION OF THE EMBODIMENTS

Figure 1:
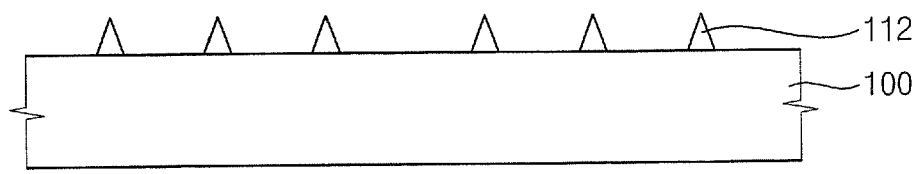
FIGS. 1 and 2 are cross-sectional diagrams illustrating a known method of forming a single crystalline silicon layer.

The present invention is described more fully hereinafter with reference to the accompanying drawings, in which embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
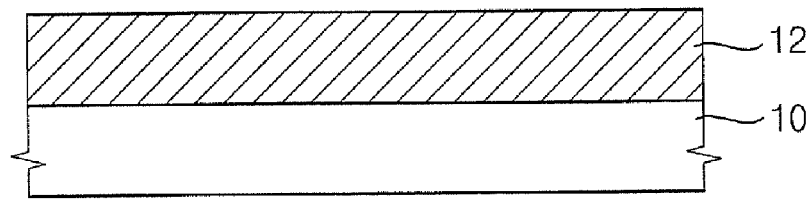
FIG. 3 is a cross-sectional diagram illustrating a semiconductor device in accordance with some embodiments of the present invention.

FIG. 3 is a cross-sectional diagram illustrating a semiconductor device in accordance with some embodiments of the present invention. As shown in FIG. 3, the semiconductor device includes a seed layer 10 and a single crystalline silicon layer 12 formed on the seed layer 10. In some embodiments, the seed layer 10 may include silicon. The seed layer 10 may be formed by a selective epitaxial growth (SEG) process such as, for example, a liquid phase epitaxy process, a vapor phase epitaxy process or a molecular beam epitaxy process.

The single crystalline silicon layer 12 may be formed on the seed layer 10 from an amorphous silicon layer (not shown) by transforming the amorphous silicon layer into a single crystalline structure using silicon in the seed layer 10 as a seed for crystallization during a phase change of the amorphous silicon layer that occurs when a laser beam is irradiated onto the amorphous silicon layer. The crystalline structure transformation may progress along both a vertical direction and a lateral direction in the amorphous silicon layer.

In some embodiments, the amorphous silicon layer is formed on the seed layer 10. The laser beam is irradiated onto the amorphous silicon layer to transform the amorphous silicon layer into the single crystalline silicon layer 12. The laser beam changes a phase of the amorphous silicon layer to a liquid phase, and thus silicon contained in the seed layer 10 serves as the seed for crystallizing the amorphous silicon layer. The phase change and the crystal structure transformation of the amorphous silicon layer may be carried out within as little as a few nanoseconds, which may be sufficiently fast such that the amorphous silicon layer may not flow down onto the surface of the seed layer 10 even though the amorphous silicon layer may be liquefied.

In some embodiments of the present invention, the laser beam may be irradiated onto the amorphous silicon layer at a sufficient intensity to liquefy the amorphous silicon layer through its whole thickness so that the amorphous silicon layer may be liquefied from a top surface thereof to a bottom surface that makes contact with the seed layer 10. In such embodiments, the energy of the laser beam may be determined based on a thickness of the amorphous silicon layer. The energy of the laser beam may be set to be sufficient to liquefy the irradiated portion of the amorphous silicon layer. In some example embodiments, the laser beam may have an energy that is set to raise the temperature of the amorphous silicon layer to no less than about 1,410° C., since the melting point of the amorphous silicon layer may be about 1,410° C.

The laser beam may cause the phase change of the amorphous silicon layer. However, the laser beam may not cause a corresponding phase change in the seed layer 10 under the amorphous silicon layer because an absorption coefficient of the seed layer 10 may be substantially different than the absorption coefficient of the amorphous silicon layer. In one example embodiment, the laser beam may include an excimer laser beam that may scan a whole surface of the amorphous silicon layer at a time in order to reduce an irradiation time of the laser beam.

In some embodiments, the resulting structure including the seed layer 10 and the amorphous silicon layer may be heated by a separate heating source (e.g., within a furnace) while the laser beam is irradiated onto the amorphous silicon layer. This separate heating operation may facilitate reducing and/or preventing the laser beam from causing a temperature gradient at the irradiated portion of the amorphous silicon layer and/or facilitate forming larger single crystalline grains at the irradiated portion of the amorphous silicon layer.

In some embodiments of the present invention, the resulting structure may be pre-heated to a temperature of about 200° C. to about 600° C. before the laser beam is applied. For example, the resulting structure may be heated to a temperature of about 350° C. to about 450° C. In one embodiment, the resulting structure may be heated to a temperature of about 400° C.

In some embodiments of the present invention, the amorphous silicon layer that is formed on the seed layer 10 may be transformed into the single crystalline silicon layer 12 by a laser irradiation within a very short time, e.g., a few nanoseconds or less, although longer time may be required. As silicon included in the seed layer 10 may act as the seed for crystallizing the amorphous silicon layer, the sizes of the grains in the single crystalline silicon layer 12 may be enlarged and the single crystalline silicon layer 12 may have a general crystalline structure, the same as that of the seed layer 10, so that the single crystalline silicon layer 12 may have a Miller's index, that is the same or about the same as that of the seed layer 10.

According to some embodiments of the present invention, when a semiconductor device has a single crystalline silicon layer that includes a relatively high density of large grains, the semiconductor device may have a high degree of integration due to the single crystalline silicon layer.

Figure 4:
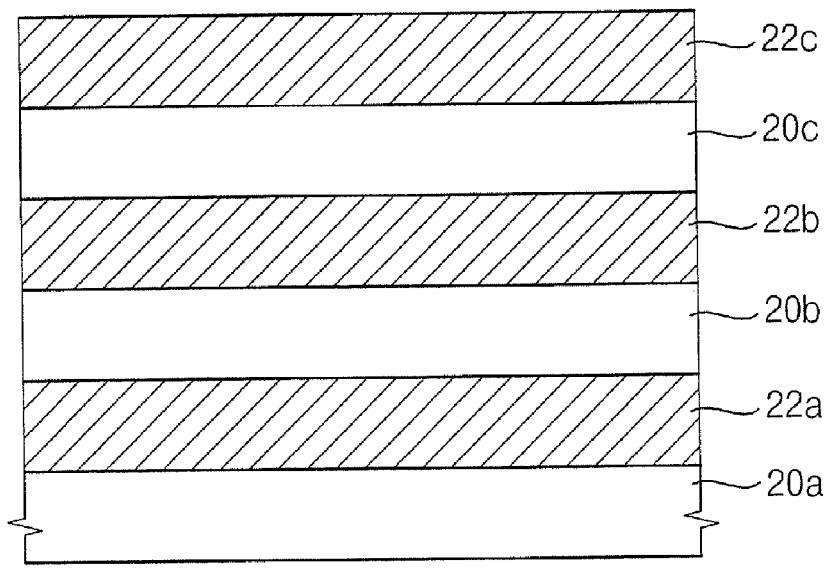
FIG. 4 is a cross-sectional diagram illustrating a semiconductor device in accordance with further embodiments of the present invention.

FIG. 4 is a cross-sectional diagram illustrating a semiconductor device in accordance with further embodiments of the present invention.

As illustrated in FIG. 4, the semiconductor device includes a first seed layer 20a, a first single crystalline silicon layer 22a, a second seed layer 20b, a second single crystalline silicon layer 22b, a third seed layer 20c, and a third single crystalline silicon layer 22c.

In some embodiments, the first seed layer 20a may include silicon. The first seed layer 20a may be formed by a selective epitaxial growth (SEG) process. In some embodiments, the first seed layer 20a may be formed using a vapor phase epitaxy process. The second and the third seed layers 20b and 20c may be, but not necessarily, formed by the same process that is used to form the first seed layer 20a.

The first single crystalline silicon layer 22a may be formed on the first seed layer 20a by transforming an amorphous silicon layer (not shown) into a single crystalline structure using silicon included in the first seed layer 20a as a seed for crystallization during a phase change of the amorphous silicon layer by irradiating a laser beam onto the amorphous silicon layer. In some embodiments, the amorphous silicon layer may be formed on the first seed layer 20a, and then the laser beam may be irradiated onto the amorphous silicon layer to transform the amorphous silicon layer into the first single crystalline silicon layer 22a. Substantially similar processes may be employed to form the second single crystalline silicon layer 22b on the second seed layer 20b using silicon included in the second seed layer 20b as a seed for crystallization, and to form the third single crystalline silicon layer 22c on the third seed layer 20c using silicon included in the third seed layer 20c as a seed for crystallization. In some embodiments, the first seed layer 20a, the first single crystalline silicon layer 22a, the second seed layer 20b, the second single crystalline silicon layer 22b, the third seed layer 20c, and the third single crystalline silicon layer 22c may be sequentially stacked.

Although the above-described embodiments of the present invention have been described as including a first seed layer, a second seed layer, a third seed layer, a first single crystalline silicon layer, a second single crystalline silicon layer and a third single crystalline silicon layer that are stacked alternately with one another, additional seed layers and single crystalline silicon layers may be alternately stacked on the third single crystalline silicon layer, as will be understood by those of ordinary skill in the art in light of the present invention. For example, a fourth seed layer (not illustrated) may be formed on the third single crystalline silicon layer by a process substantially the same as the process used to form the first seed layer 20a, and a fourth single crystalline silicon layer may be formed on the fourth seed layer by a process substantially the same as the process used to form the first single crystalline silicon layer 22a. Additional alternating layers may also be provided. Other intervening layers and/or structures may also be included. When a semiconductor device includes several single crystalline silicon layers having high densities of large-sized grains and these single crystalline silicon layers are repeatedly stacked, the semiconductor device may have a high degree of integration.

Figure 6:
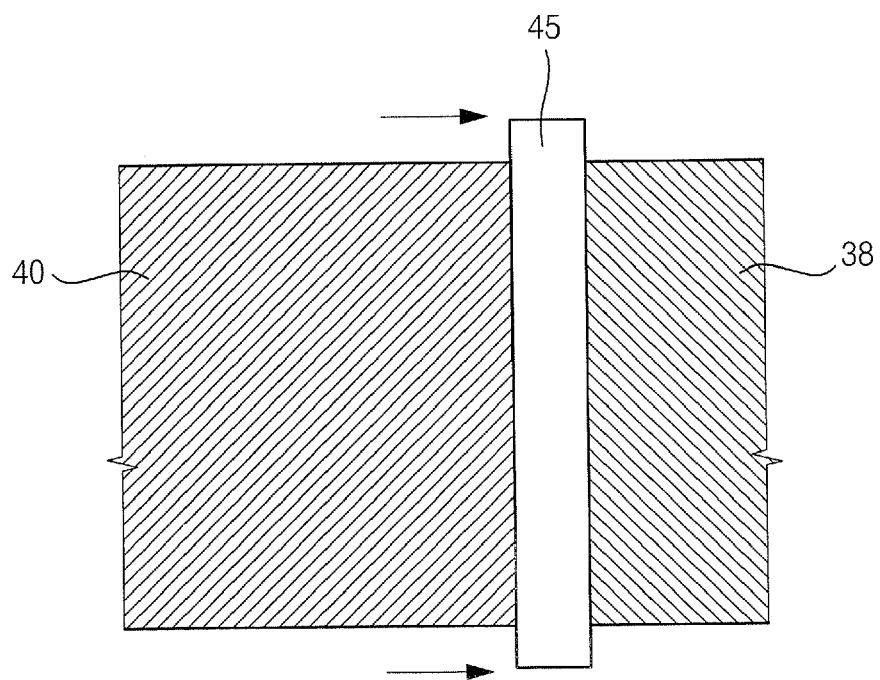
FIG. 6 is a plan view illustrating a laser irradiation operation of FIG. 5D.
Figure 7:
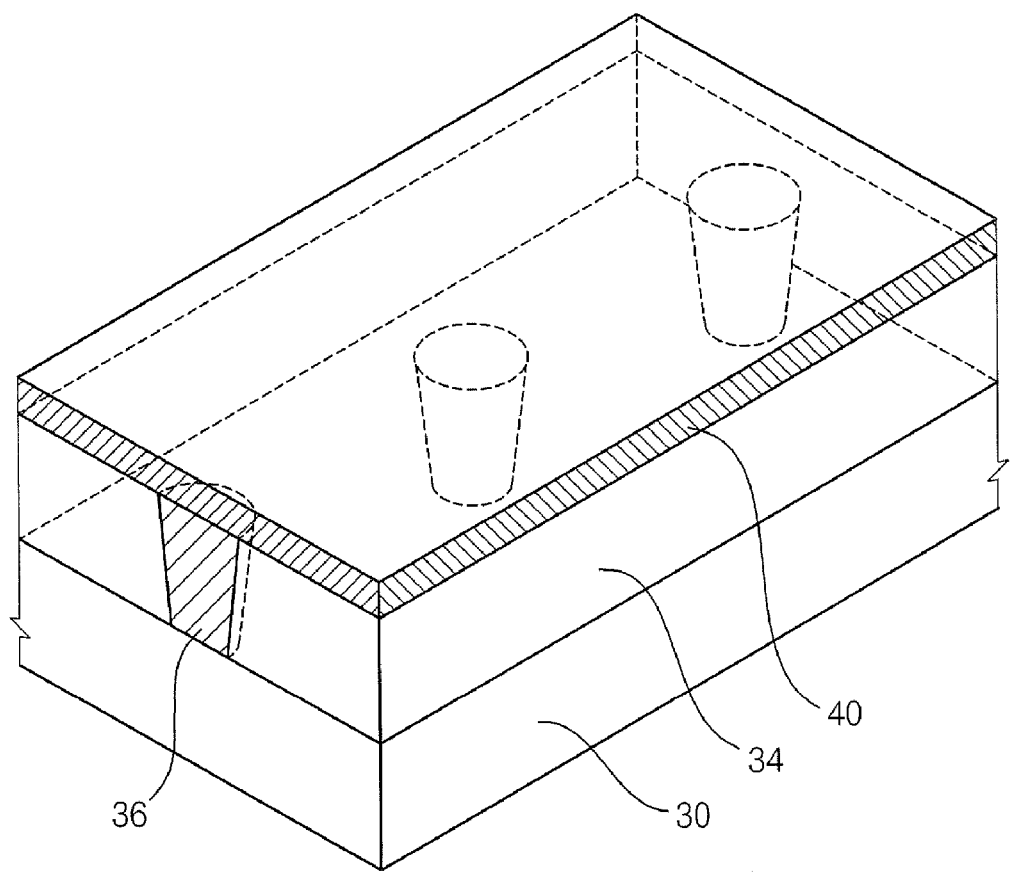
FIG. 7 is a perspective diagram illustrating a semiconductor device according to embodiments of the present invention.

Hereinafter, methods of manufacturing semiconductor devices according to embodiments of the present invention will be described with reference to FIGS. 5 through 7. FIGS. 5A to 5G are cross-sectional diagrams illustrating methods of manufacturing semiconductor devices according to some embodiments of the present invention. FIG. 6 is a plan view illustrating the laser irradiation operation of FIG. 5D. FIG. 7 is a perspective view illustrating a semiconductor device according to embodiments of the present invention.

Figure 5A:
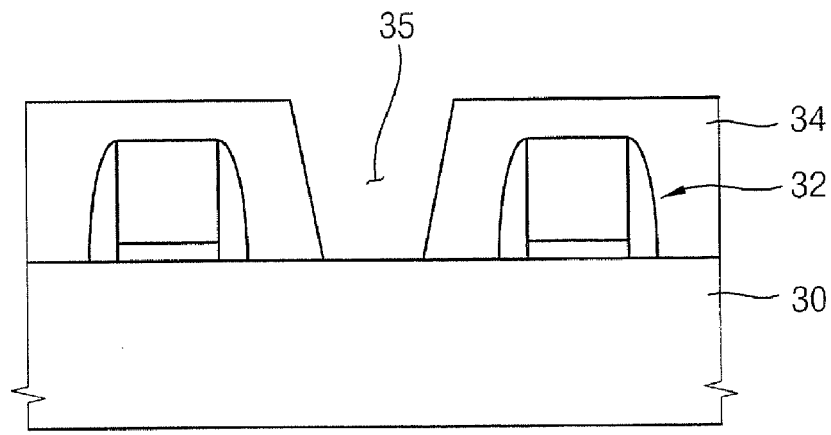
FIGS. 5A to 5G are cross-sectional diagrams illustrating methods of manufacturing semiconductor devices in accordance with some embodiments of the present invention.

As shown in FIG. 5A, a first semiconductor structure 32 such as, for example, a gate electrode is formed on a substrate 30. The substrate 30 may include silicon. The first semiconductor structure 32 may include metal wirings, a logic device and other various structures as well as the gate electrode. An insulation layer 34 such as an oxide layer is formed on the substrate 30 and the first semiconductor structure 32. The insulation layer 34 is subjected to an etching process using a photoresist pattern as an etching mask to form an opening 35 through which a surface of the substrate 30 is partially exposed. The opening 35 may also be created in other ways known to those of skill in the art.

Figure 5B:
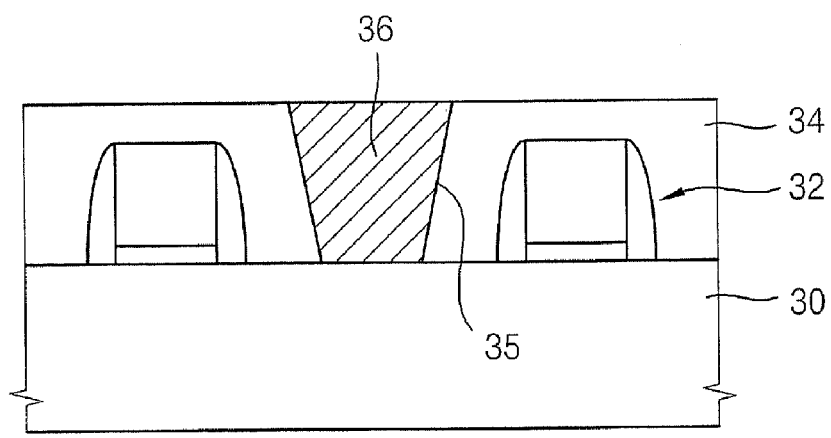

Referring to FIG. 5B, an SEG process is performed about the silicon substrate 30 having the first semiconductor structure 32 thereon. In some embodiments, the SEG process may include a vapor phase epitaxy process. As shown in FIG. 5B, a single crystal having a crystalline structure substantially the same as that of the substrate 30 may be grown from a surface of the substrate 30 that is exposed through the opening 35 to form a single crystalline epitaxial layer 36 in the opening 35. In some embodiments, the single crystalline epitaxial layer 36 may be grown to an inlet portion of the opening 35, so that the opening 35 may be filled with the single crystalline epitaxial layer 36.

Figure 5C:
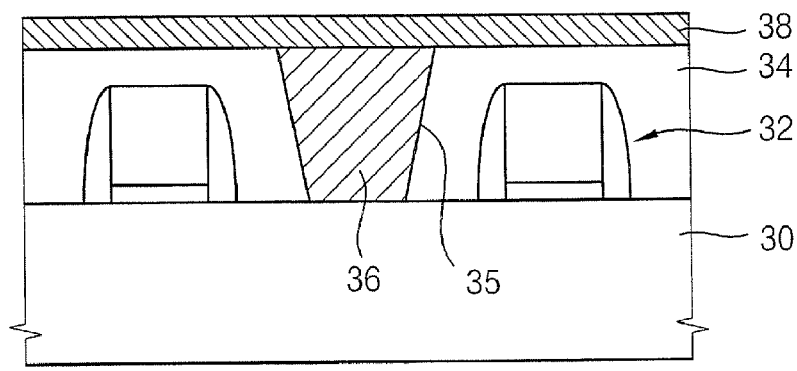

As illustrated in FIG. 5C, an amorphous silicon layer 38 may be formed on the insulation layer 34 and the single crystalline epitaxial layer 36. The amorphous silicon layer 38 may be formed, for example, by a chemical vapor deposition (CVD) process. The amorphous silicon layer 38 may be a thick layer or a thin layer. In some example embodiments, the amorphous silicon layer 38 may be formed as a very thin layer.

Figure 5D:
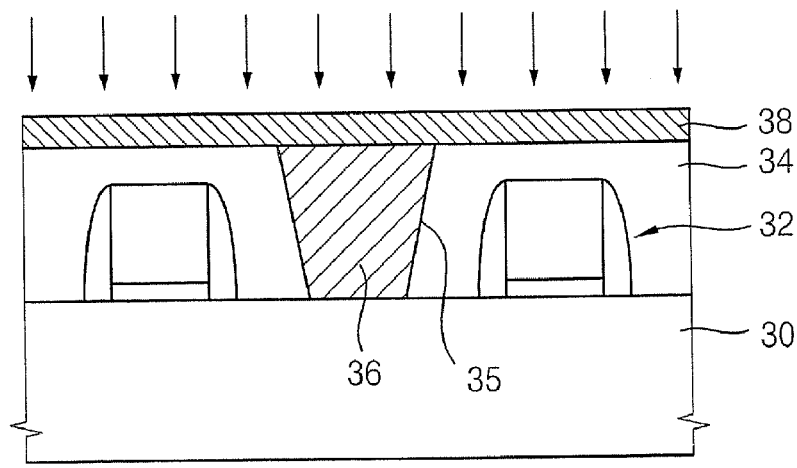

As illustrated in FIG. 5D, a laser beam may be irradiated onto the amorphous silicon layer 38. In some embodiments, a scanning member 45 may be used such that a predetermined area and/or a defined area of the amorphous silicon layer 38 may be irradiated at one time as illustrated in FIG. 6. Additionally, in some embodiments, the substrate 30 (and/or the entire structure) may be heated during such laser irradiation. Example temperatures to which the substrate 30 and/or the resulting structure may be heated are between about 200° C. and about 600° C. such as, for example, a temperature of about 400° C.

Figure 5E:
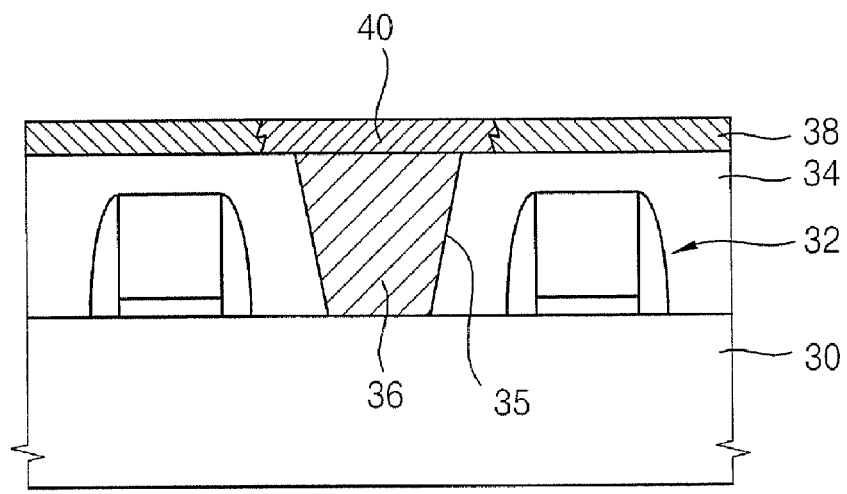
Figure 5F:
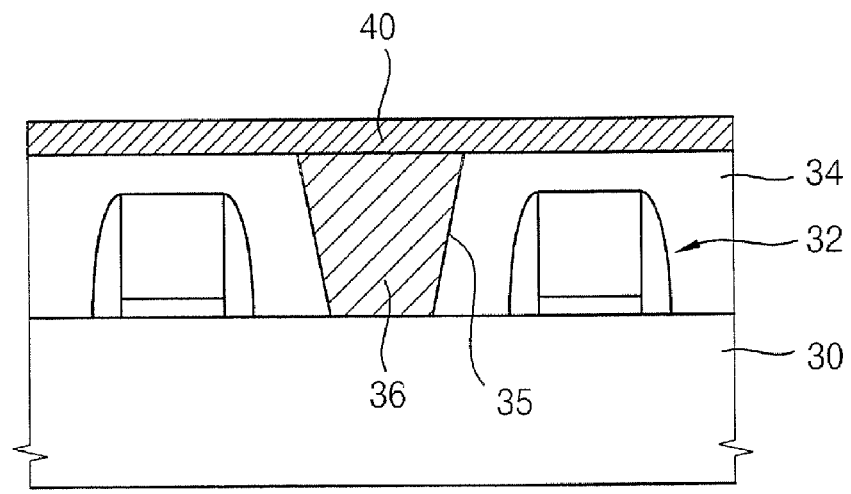

Referring to FIGS. 5E and 5F, the laser irradiation may cause a phase change in the amorphous silicon layer 38. In some embodiments, the amorphous silicon layer 38 may be melted by the laser irradiation such that the amorphous silicon layer 38 may be liquefied. The entire thickness of the effected part of the amorphous silicon layer 38 may be changed into a liquid phase. The amorphous silicon layer 38 may be transformed into a single crystalline structure during the phase change using silicon included in the single crystalline epitaxial layer 36 as a seed for crystallizing the amorphous silicon layer 38. Thus, the amorphous silicon layer 38 may be converted into a single crystalline silicon layer 40 by the laser beam irradiation. After completing the laser irradiation on the whole surface of the amorphous silicon layer 38, the amorphous silicon layer 38 may be transformed into the single crystalline silicon layer 40 as shown in FIG. 7. The single crystalline silicon layer 40 may be used to form active region(s) in subsequent processes for manufacturing the semiconductor device. In FIG. 7, the semiconductor structures 32 on the substrate 30 are omitted in order to clearly illustrate the single crystalline silicon layer 40.

In some example embodiments, the laser irradiation on the amorphous silicon layer 38 may be used to transform the amorphous silicon layer 38 into the single crystalline silicon layer 40 using the single crystalline epitaxial layer 36 as a seed for crystallization. The single crystalline silicon layer 40 may include a relatively high density of large grains.

Figure 5G:
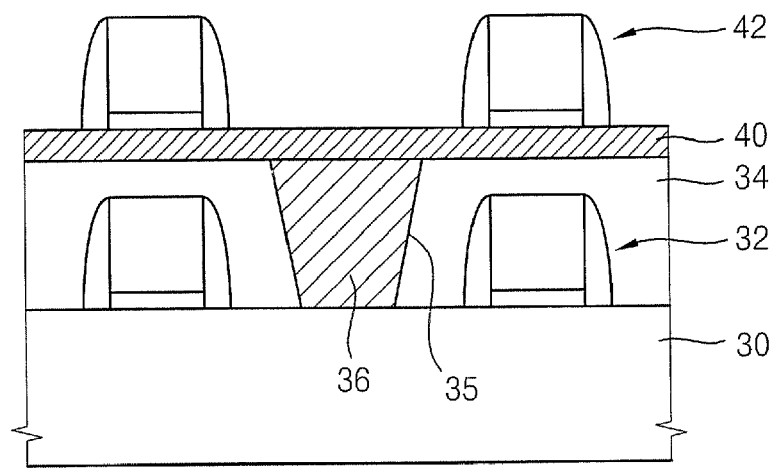

As illustrated in FIG. 5G, a second semiconductor structure 42 such as a gate electrode may be formed on the single crystalline silicon layer 40. A channel and source/drain regions may also be formed at upper portions of the single crystalline silicon layer 40. Additionally, the semiconductor structure 42 may include, for example, metal wirings, a logic device and other various structures as well as the gate electrode.

Figure 8A:
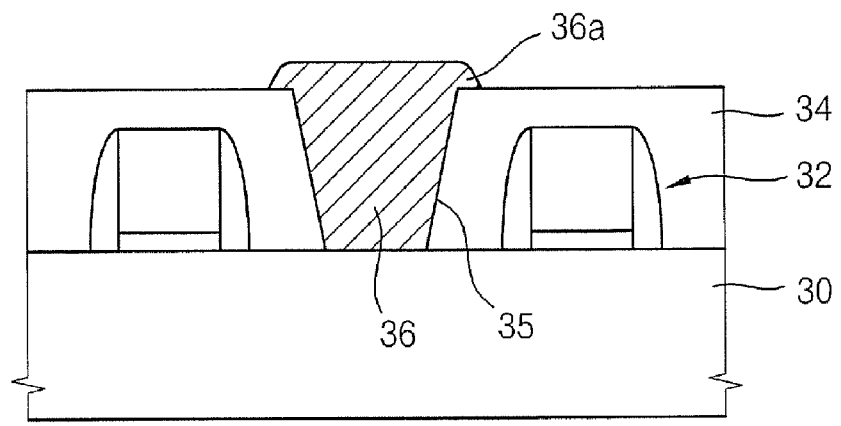
FIGS. 8A to 8B are cross-sectional diagrams illustrating methods of manufacturing semiconductor devices according to further embodiments of the present invention.
Figure 8B:
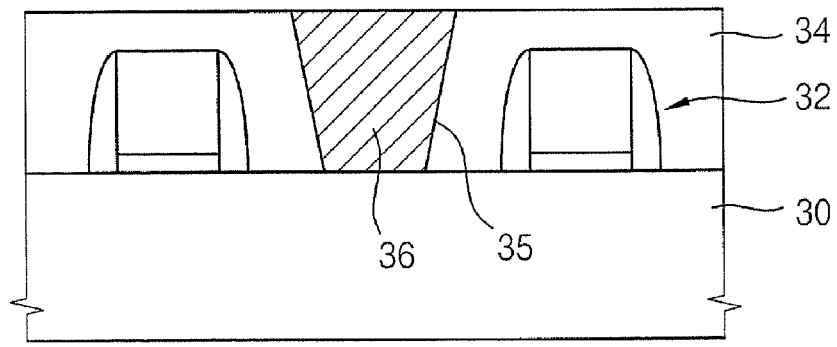

FIGS. 8A and 8B are cross-sectional diagrams illustrating methods of manufacturing semiconductor devices according to further embodiments of the present invention.

As illustrated in FIG. 8A, a semiconductor structure 32 such as a gate electrode is formed on a substrate 30 by, for example, the processes described above with reference to FIGS. 5 to 7. The substrate 30 may include silicon. Then, an insulation layer 34 is formed on the substrate 30. The insulation layer 34 may include an opening 35 through which a surface of the substrate 30 is partially exposed. An SEG process may be performed about the substrate 30 including the semiconductor structure 32 thereon. The SEG process may include a vapor phase epitaxy process. As a result, a single crystalline material that has a crystalline structure substantially the same as that of the substrate 30 may be grown from a surface of the substrate 30 that is exposed through the opening 35 to thereby form a single crystalline epitaxial layer 36 in the opening 35. The epitaxial layer 36 may be grown over an inlet portion of the opening 35, so that a top face of the insulation layer 34 around the inlet portion of the opening 35 is covered with the epitaxial layer 36. In the drawings, the portion of the epitaxial layer that protrudes over the insulation layer 34 is denoted by reference numeral 36a to distinguish it from the portion 36 of the epitaxial layer that is within the opening 35.

Referring to FIG. 8B, the epitaxial layer 36a that is on the insulation layer 34 is removed from the top surface of the insulation layer 34. The epitaxial layer 36a may be partially removed by, for example, a chemical mechanical polishing (CMP) process. The CMP (or another) process may be used to expose the insulation layer 34. As illustrated in FIG. 8B, the epitaxial layer 36 at least partially remains in the opening 35. Then, a single crystalline silicon layer may be formed by processes substantially the same as those described with reference to FIGS. 5-7, and a semiconductor device may be formed on the single crystalline silicon layer.

Figure 9:
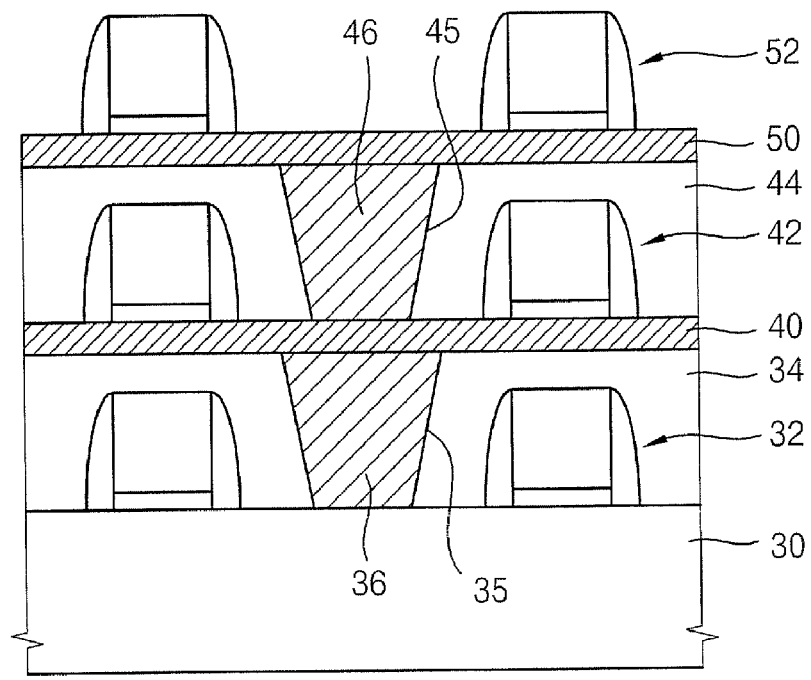
FIG. 9 is a cross-sectional diagram illustrating methods of manufacturing semiconductor devices according to still further embodiments of the present invention.

FIG. 9 is a cross-sectional diagram illustrating a method of manufacturing a semiconductor device according to still further embodiments of the present invention. In FIG. 9, the semiconductor device may have a basic structure that is substantially the same as the basic structure of the semiconductor device described with reference to FIG. 5A except that the basic structure is repeated to provide a semiconductor device in which the basic structure is repeatedly stacked. The insulation layer 34, the opening 35, the epitaxial layer 36 and the single crystalline silicon layer 40 in FIG. 5G may be referred to as a first insulation layer 34, a first opening 35, a first epitaxial layer 36 and a first single crystalline silicon layer 40, respectively, in FIG. 9.

As illustrated in FIG. 9, a first semiconductor structure 32 such as a gate electrode, the first insulation layer 34 having the first opening 35, the first epitaxial layer 36 in the first opening 35, the first single crystalline silicon layer 40 and a second semiconductor structure 42 are formed on a substrate 30. The substrate 30 may include silicon. These layers and structures may be formed by processes substantially the same as those described with reference to FIGS. 5A to 5G.

A second insulation layer 44 is formed on the first single crystalline silicon layer 40. The second insulation layer 44 has a second opening 45 thorough which a surface of the first single crystalline silicon layer 40 is partially exposed. The second opening 45 may be formed by, for example, a process that is substantially the same as the process used to expose the substrate 30 through the first insulation layer 34.

A second epitaxial layer 46 is grown in the second opening 45. The second epitaxial layer 46 may be formed in the second opening 45 by, for example, a process substantially the same as the process used to form the first epitaxial layer 36 in the first opening 35.

A second single crystalline silicon layer 50 is formed on the second insulation layer 44 and the second epitaxial layer 46. The second single crystalline silicon layer 50 may be used as an active region of the semiconductor device.

A third semiconductor structure 52 such as a gate electrode is formed on the second single crystalline silicon layer 50. A channel and source/drain regions may be formed at upper portions of the second single crystalline silicon layer 50. The third semiconductor structure 52 may additionally include, for example, metal wirings, a logic device and/or other various structures.

In some embodiments of the present invention, additional single crystalline silicon layers and semiconductor structures may be stacked on the second single crystalline silicon layer 50. It will also be appreciated that the particular semiconductor structures provided on and/or in any given single crystalline silicon layer may vary.

Figure 10:
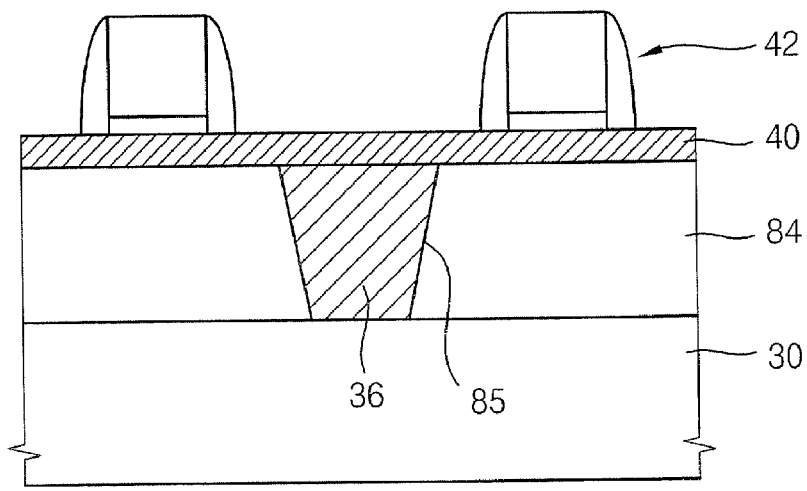
FIG. 10 is a cross-sectional diagram illustrating methods of manufacturing semiconductor devices according to additional embodiments of the present invention.

FIG. 10 is a cross sectional diagram illustrating methods of manufacturing semiconductor devices according to additional embodiments of the present invention. As illustrated in FIG. 10, an insulation layer 84 including an oxide layer is formed on a substrate 30. The substrate 30 may include silicon. An opening 85 is provided in the insulation layer 84 through which a surface of the substrate 30 is partially exposed. An epitaxial layer 36 is formed in the opening 85. Then, a single crystalline silicon layer 40 is formed on the insulation layer 84 and the epitaxial layer 36 by processes, for example, that are substantially the same as those described above with reference to FIGS. 5A to 5G. A semiconductor structure 42 such as a gate electrode may then be formed on and/or in the single crystalline silicon layer 40.

In some embodiments of the present invention, a silicon-on-insulator (SOI) substrate may be used instead of the substrate 30 used in the above-described embodiments of the present invention. For example, in some embodiments, a first semiconductor structure and an insulation layer having an opening may be formed on the SOI substrate. An epitaxial layer may be formed in the opening. A single crystalline silicon layer may then be formed on the silicon layer and the epitaxial layer, and a second semiconductor structure may be formed on the single crystalline silicon layer.

In some embodiments of the present invention, the amorphous layer (e.g., the amorphous silicon layer 38) may be replaced by a polycrystalline layer or a layer that includes both amorphous and polycrystalline regions. Thus, it will be appreciated that embodiments of the present invention are not limited to converting amorphous layers into single crystalline layers, but also encompass converting other types of non-single crystalline layers into crystalline layers.

EXAMPLE 1

A single crystalline silicon layer was formed by processes substantially the same as those described above with reference to FIGS. 5A to 5G. The single crystalline silicon layer was formed from an amorphous silicon layer having a thickness of about 250 Å, and a laser having an energy intensity of about 240 mJ/cm$^2$ was irradiated onto the amorphous silicon layer.

Figure 11A:
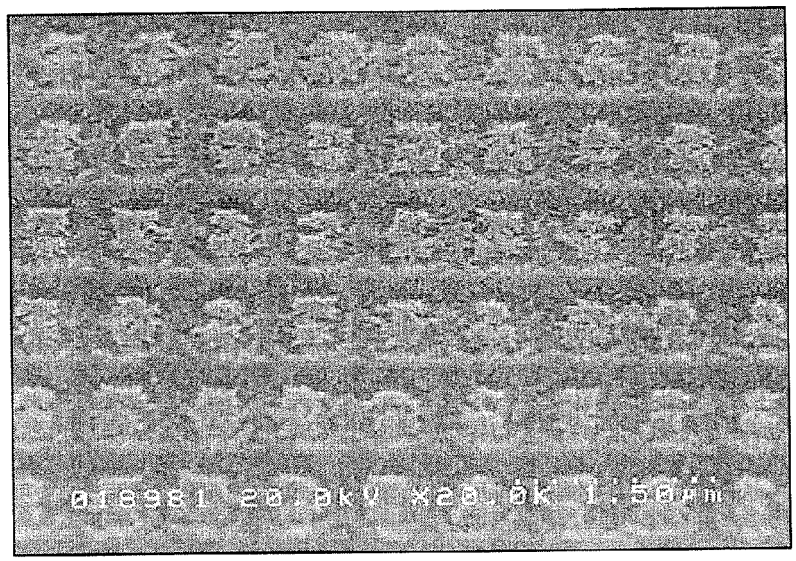
FIGS. 11A and 11B are scanning electron microscope (SEM) photographs illustrating a surface of a single crystalline silicon layer manufactured according to Example 1 of the present specification.
Figure 11B:
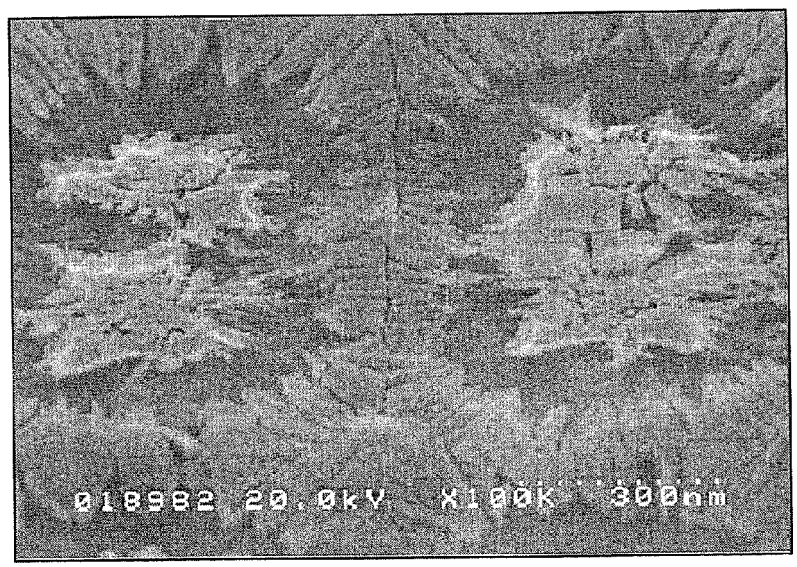

FIGS. 11A and 11B are scanning electron microscope (SEM) photographs illustrating a surface of the single crystalline silicon layer. FIG. 11B is an enlarged SEM photograph illustrating one of the grains illustrated in FIG. 11A.

FIG. 11A shows that high-density grains were formed in the single crystalline silicon layer, and sizes of the grains in the single crystalline silicon layer were about 2000 Å wide by about 2000 Å long.

EXAMPLE 2

A second single crystalline silicon layer was formed by processes substantially the same as those of Example 1 except that the laser had an energy intensity of about 300 mJ/cm$^2$.

Figure 12A:
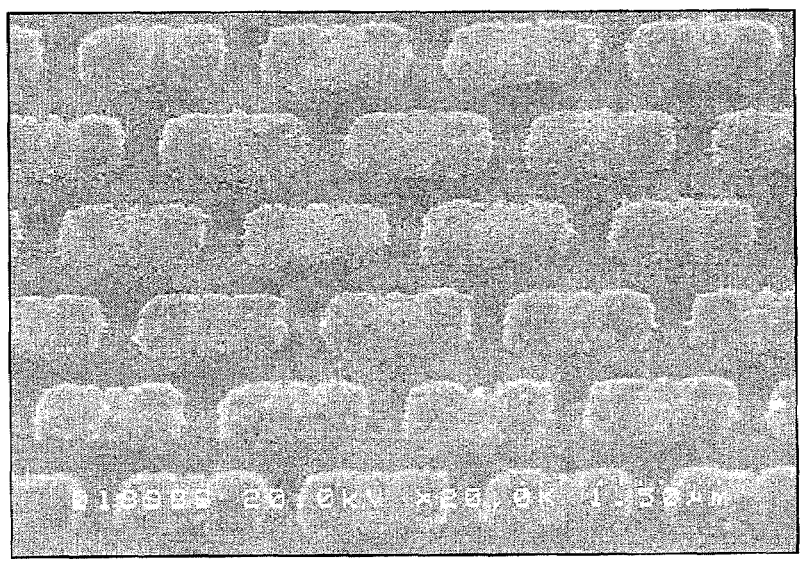
FIGS. 12A and 12B are SEM photographs illustrating a surface of another single crystalline silicon layer manufactured according to Example 2 of the present specification.
Figure 12B:
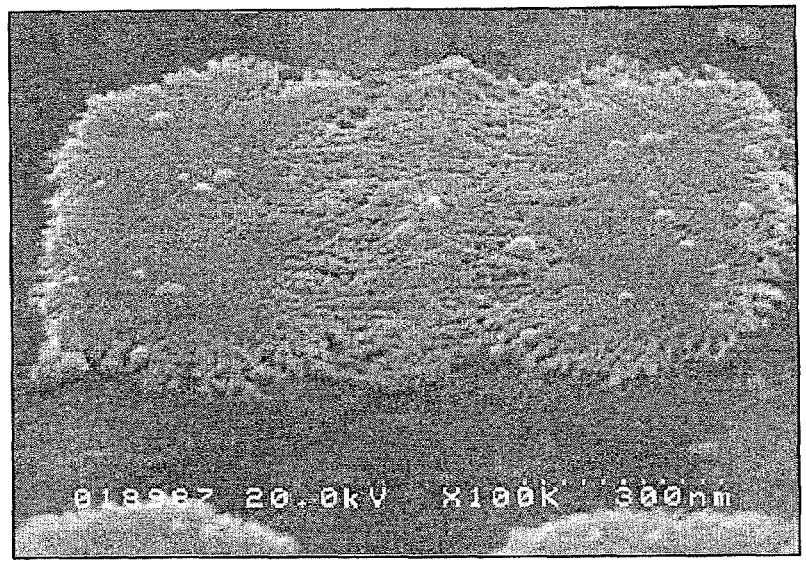

FIGS. 12A and 12B are SEM photographs illustrating a surface of the single crystalline silicon layer of Example 2. FIG. 12B is an enlarged SEM photograph illustrating one of the grains illustrated in FIG. 12A.

FIG. 12A shows that high-density grains were formed in the single crystalline silicon layer of Example 2, and that the sizes of those grains were about 5.5 µm wide by about 1.5 µm long.

COMPARATIVE EXAMPLE

Figure 13A:
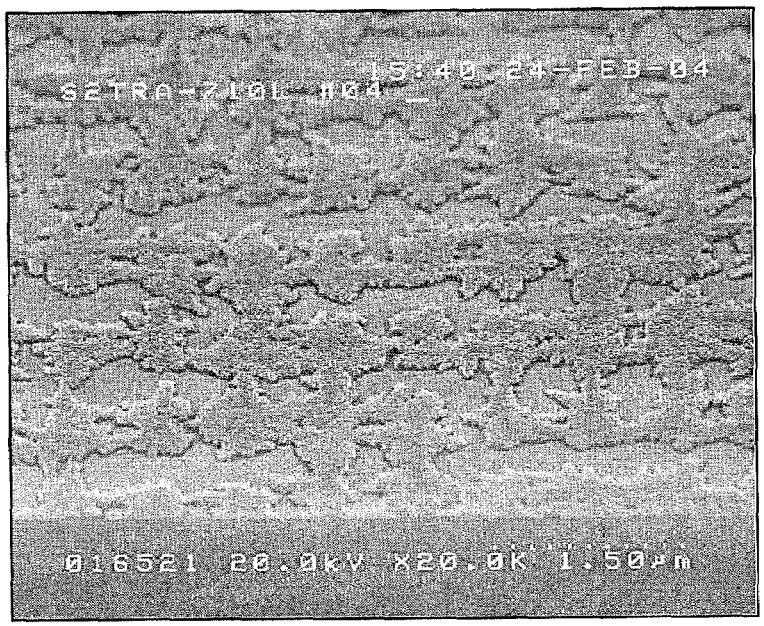
FIGS. 13A and 13B are SEM photographs illustrating a surface of a conventional single crystalline silicon layer.
Figure 13B:
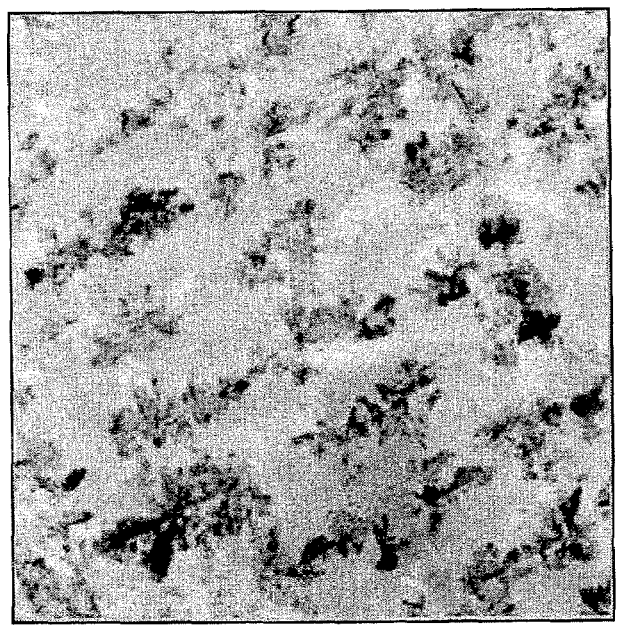

A conventional single crystalline silicon layer was obtained in a furnace by a heat treatment at a temperature of about 600° C. FIGS. 13A and 13B are SEM photographs illustrating a surface of this single crystalline silicon layer. FIG. 13B is an enlarged SEM photograph illustrating one of the grains illustrated in FIG. 13A.

FIG. 13A shows grains that were randomly arranged in the conventional single crystalline silicon layer. Sizes of the grains in the conventional single crystalline silicon layer could not be estimated because the sizes of the grains were too small to estimate, as indicated in FIG. 13B.

According to Examples of the present invention, single crystalline silicon layers may be provided that have a high density of large grains.

FIGS. 14A through 14D are cross-sectional diagrams illustrating methods of manufacturing semiconductor devices in accordance with still further embodiments of the present invention.

Figure 14A:
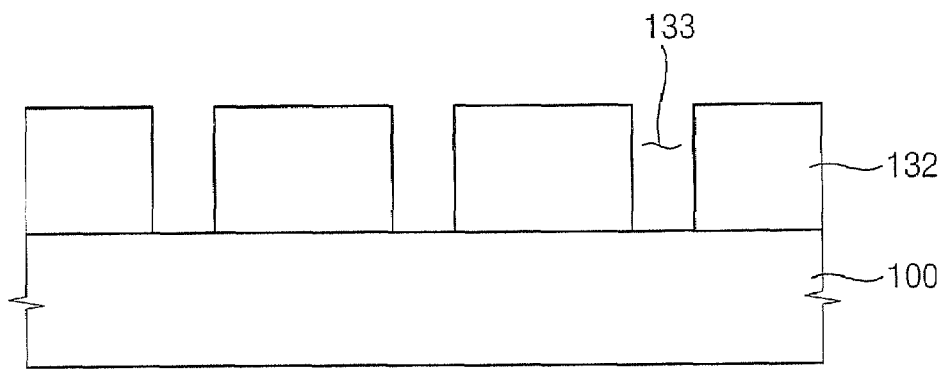
FIGS. 14A and 14D are cross-sectional diagrams illustrating methods of manufacturing semiconductor devices in accordance with additional embodiments of the present invention.

Referring to FIG. 14A, a first single crystalline layer 100 is formed on a substrate (not illustrated). The substrate may comprise, for example, a semiconductor substrate or a metal oxide substrate. In some embodiments, the substrate may comprise a silicon substrate, a germanium substrate, a silicon germanium substrate, an SOI substrate, an aluminum oxide substrate, a strontium titanium oxide substrate, etc.

In one embodiment, the first single crystalline layer 100 may be a single crystalline silicon layer. The first single crystalline layer 100 may be formed by an SEG process. In other embodiments, the first single crystalline layer 100 may include a single crystalline germanium layer, a single crystalline silicon germanium layer, etc.

In some embodiments, a semiconductor structure (not illustrated) may be formed on the first single crystalline layer 100. The semiconductor structure may include, for example, metal wirings, a logic device, a gate electrode and/or a transistor. Various semiconductor structures may be formed on the first single crystalline layer 100 in accordance with a design of the semiconductor device.

A first insulation layer 132 is formed on the first single crystalline layer 100. The first insulation layer 132 may be formed using, for example, oxide. When the first single crystalline layer 100 includes silicon, the first insulation layer 132 may include, for example, a silicon oxide layer.

After a photoresist pattern (not illustrated) is formed on the first insulation layer 132, the first insulation layer 132 is partially etched using the photoresist pattern as an etching mask. Thus, one or more openings 133 may be formed through the first insulation layer 132 to partially expose the first single crystalline layer 100. The photoresist pattern may be removed from the first insulation layer 132 by, for example, an ashing process and/or a stripping process.

Figure 14B:
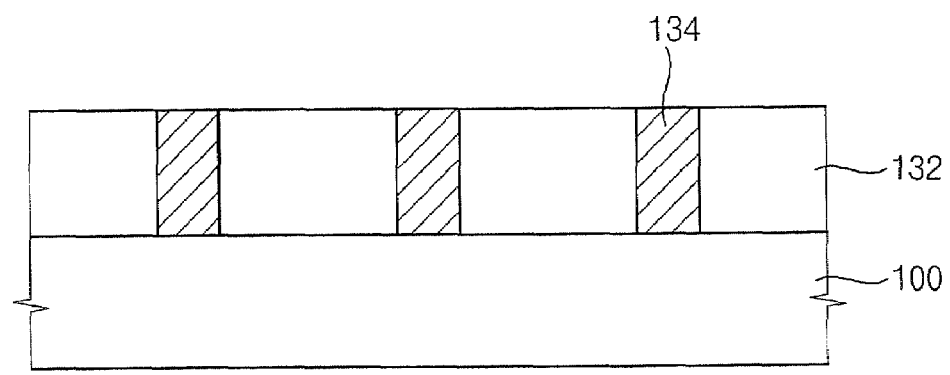

Referring to FIG. 14B, the opening 133 may be sufficiently filled with a single crystalline material. The single crystalline material filling the opening 133 serves as a first seed layer 134. The first seed layer 134 may be formed, for example, by an SEG process. When the first single crystalline layer 100 includes silicon, the first seed layer 134 may include single crystalline silicon. When the first single crystalline layer 100 includes silicon germanium, the first seed layer 134 may include single crystalline silicon germanium. That is, the single crystalline material in the first seed layer 134 may vary in accordance with the material that comprises the first single crystalline layer 100.

In some embodiments, the first seed layer 134 may include the single crystalline material sufficiently filling the opening 133 by the SEG process. Since the first seed layer 134 may grow from a surface of the first single crystalline layer 100, the first seed layer 134 may have a crystalline structure substantially the same as that of the first single crystalline layer 100.

Figure 15:
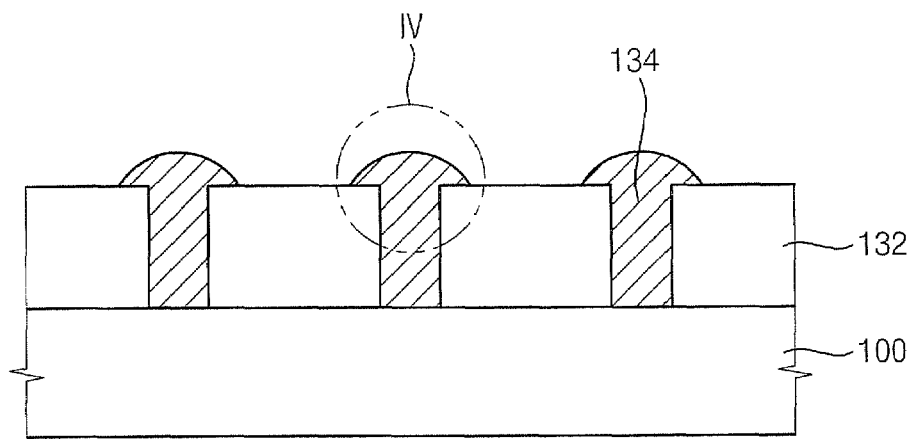
FIG. 15 is a cross-sectional diagram illustrating a process for forming the seed layer 134 in FIG. 14B.

FIG. 15 is a cross-sectional diagram illustrating a process for forming the seed layer 134 in FIG. 14B.

As illustrated in FIGS. 14B and 15, the first seed layer 134 filling the opening 133 may be formed on a portion of the first insulation layer 132 around an upper portion of the opening 133. That is, the first seed layer 134 may include a somewhat over-grown portion IV around the upper portion of the opening 133 so as to sufficiently fill up the opening 133. The over-grown portion IV of the first seed layer 134 may be removed after a formation of the first seed layer 134. For example, the over-grown portion IV of the first seed layer 134 may be removed by a CMP process. Thus, the first seed layer 134 may have a thickness (i.e., a height above the substrate) that is substantially the same as that of the first insulation layer 132. Additionally, the first seed layer 134 and the first insulation layer 132 may have level surfaces.

Figure 14C:
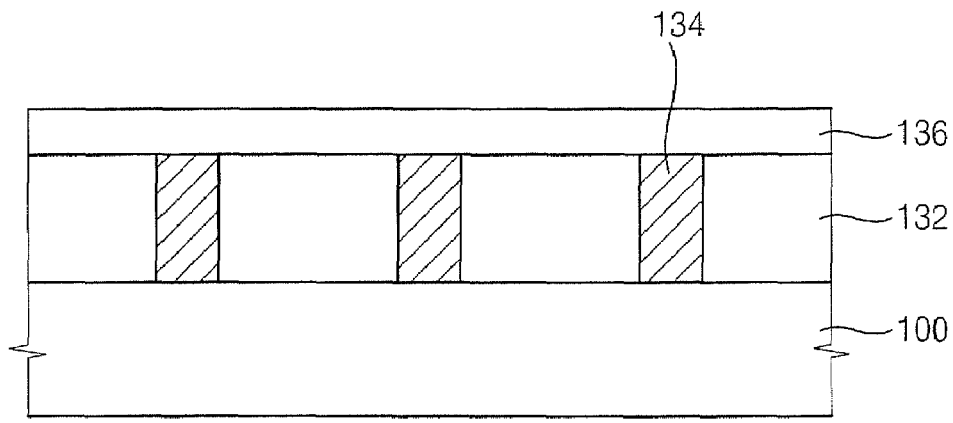

As illustrated in FIG. 14C, an amorphous layer 136 is formed on the first seed layer 134 and the first insulation layer 132. The amorphous layer 136 may include an amorphous material. The material included in the amorphous layer 136 may vary based on the single crystalline material included in the first seed layer 134. For example, when the first seed layer 134 includes single crystalline silicon, the amorphous layer 136 may include amorphous silicon. On the other hand, the amorphous layer 136 may include amorphous silicon germanium when the first seed layer 134 includes single crystalline silicon germanium.

When the amorphous layer 136 includes amorphous silicon, the amorphous layer 136 may be formed, for example, by a CVD process. The thickness of the amorphous layer 136 may vary based on, for example, the degree of integration of the semiconductor device. The amorphous layer 136 may be relatively thin if the semiconductor device has a high degree of integration.

Figure 2:
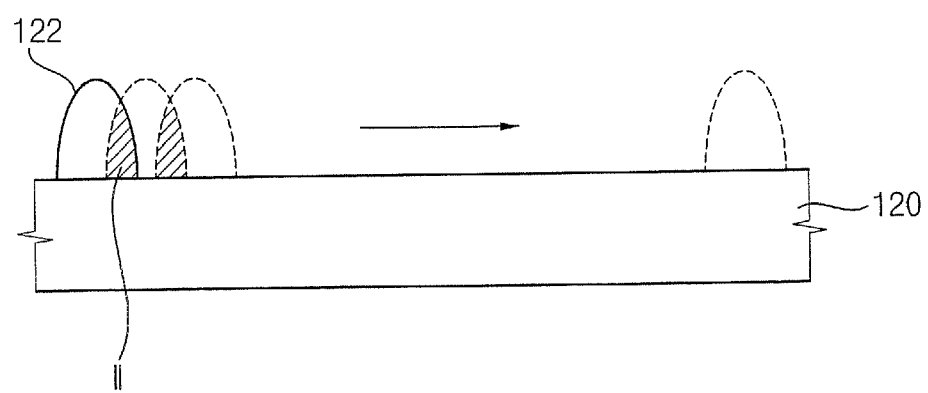
Figure 14D:
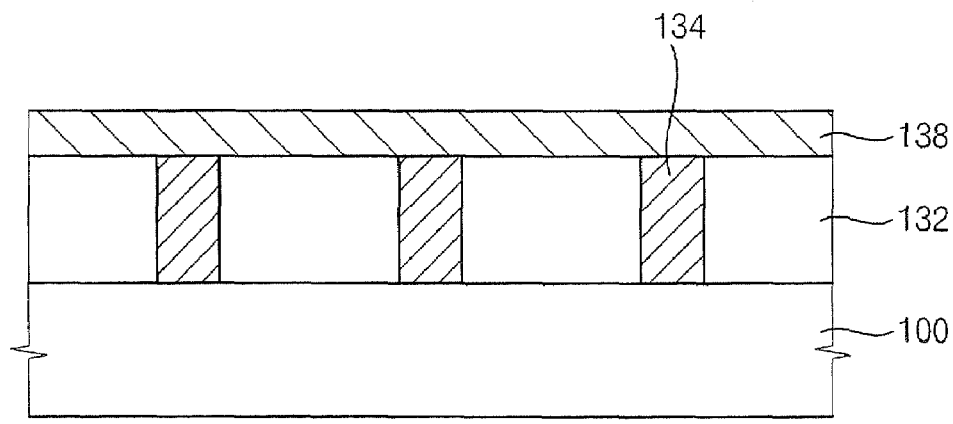

Referring to FIG. 14D, a laser beam is irradiated onto the amorphous layer 136. The laser beam may have an energy sufficient to melt the amorphous layer 136. The laser beam may be irradiated onto the amorphous layer 136 without generating superimposedly irradiated regions of the amorphous layer 136. That is, the laser beam may not be superimposedly irradiated onto each of regions of the amorphous layer 136. As a result, the sharp protrusions that may be generated when the methods described above with respect to FIGS. 1 and 2 may be avoided on the second single crystalline layer 138 that is formed from the amorphous layer 136. When the amorphous layer 136 includes amorphous silicon, the second single crystalline layer 138 may include single crystalline silicon. On the other hand, the second single crystalline layer 138 may include single crystalline silicon geranium when the amorphous layer 136 includes amorphous silicon germanium.

Figure 16:
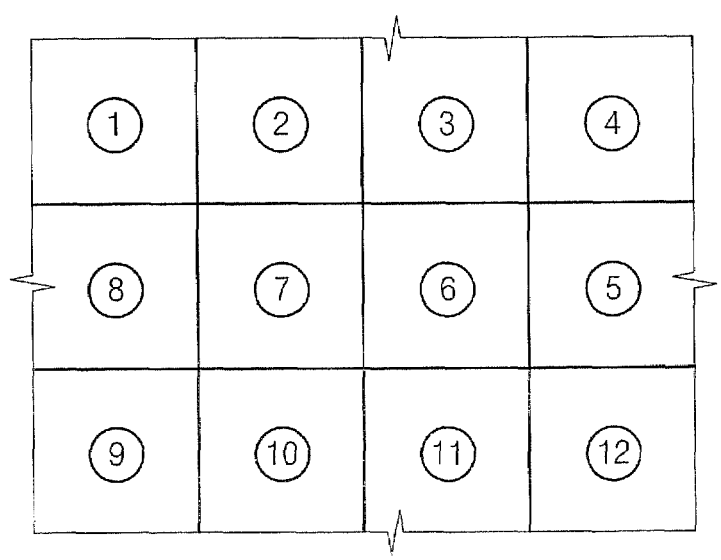
FIG. 16 is a plan view illustrating a laser beam irradiation operation of FIG. 14D.

FIG. 16 is a plan view illustrating the laser beam irradiation operation of FIG. 14D.

Referring to FIGS. 14D and 16, the laser beam is irradiated onto the amorphous layer 136 by a step-and-repetition process. For example, the amorphous layer 136 may be divided into a plurality of regions such as the regions designated 1 through 12 in FIG. 16. The laser beam may be irradiated onto region 2 of FIG. 16 after completing the laser beam irradiation of region 1. After finishing a laser beam irradiation of region 3, the laser beam may then be irradiated onto region 4 of the amorphous layer 136. In this manner, the laser beam may be separately irradiated onto each of the regions 1 through 12 of the amorphous layer 136 shown in FIG. 16. It will also be appreciated that the amorphous layer 136 may be divided into more or less than twelve regions for purposes of the laser beam irradiation and/or that the shapes of the regions may differ. When the laser beam is irradiated onto the amorphous layer 136 by the step-and-repetition process, generation of the above-described superimposedly irradiated regions may be avoided during the irradiation of the laser beam. Therefore, the second single crystalline layer 138 formed from the amorphous layer 136 may be free of protrusions (or that have reduced numbers of protrusions and/or protrusions of reduced size).

As the laser beam is irradiated onto the amorphous layer 136, a phase change of the amorphous layer 136 may occur. When the laser beam is irradiated onto each of the regions of the amorphous layer 136, each of the regions of the amorphous layer 136 is sequentially melted so that the amorphous layer 136 may have a liquid phase. In some embodiments, the phase change may be generated from a top surface of the amorphous layer 136 to a bottom surface of the amorphous layer 136. While the phase change of the amorphous layer 136 occurs, the first seed layer 134 may serve as a seed such that a crystalline structure of the amorphous layer 136 may be changed. Hence, the second single crystalline layer 138 having a single crystalline structure may be obtained using the first seed layer 134 as the seed for crystallization of the amorphous layer 136.

In some embodiments, the laser beam may have an energy that melts entire regions of the amorphous layer 136. In other words, the irradiation of the laser beam may liquefy the amorphous layer 136 from the top surface to the bottom thereof. For example, the laser beam may raise the temperature of the amorphous layer above about 1,410° C. when the amorphous layer 136 includes amorphous silicon having a melting point of about 1,410° C.

In some embodiments, the phase change of the amorphous layer 136 may proceed along a horizontal direction and a vertical direction with respect to the first seed layer 134. Since the changes to the phase and the crystalline structure of the amorphous layer 136 may occur very quickly (e.g., within several nanoseconds), the amorphous layer 136 may not flow down from the first seed layer 134 during the laser beam irradiation, even though the amorphous layer 136 may be fully liquefied.

In some embodiments, the resulting structure including the amorphous layer 136 may be thermally treated during the phase change of the amorphous layer 136. Thus, the second single crystalline layer 138 may include grains having larger sizes because a temperature gradient among the regions of the amorphous layer 136 may be reduced. The resulting structure including the amorphous layer 136 may be thermally treated (in addition to the heating caused by the laser beam), for example, at a temperature of about 200° C. to about 600° C. during the laser beam irradiation. In certain embodiments, the resulting structure including the amorphous layer 136 may be heated at a temperature of about 350° C. to about 450° C.

As described above, the second single crystalline layer 138 is formed from the amorphous layer 136 by irradiating the laser beam onto the amorphous layer 136 using the first seed layer 134 as the seed for crystallizing the amorphous layer 136. When the amorphous layer 136 includes amorphous silicon, the second single crystalline layer 138 may include single crystalline silicon. In contrast, the second single crystalline layer 138 may include single crystalline germanium or single crystalline silicon germanium when the amorphous layer 136 includes amorphous germanium or amorphous silicon germanium, respectively.

Since the laser beam may be irradiated onto each region of the amorphous layer 136 without generating superimposedly irradiated regions of the amorphous layer 136, the second single crystalline layer 138 may include a high density of large-sized grains without forming sharp protrusions on the second single crystalline layer 138.

When the second single crystalline layer 138 is employed as a channel or an active region of a semiconductor device, the semiconductor device may have improved electrical characteristics and a high degree of integration.

In some embodiments, an additional semiconductor structure may be formed on the second single crystalline layer 138. The additional semiconductor structure may also include, for example, metal wirings, a logic device, a gate electrode and/or a transistor.

In some embodiments, the semiconductor device may further include a second insulation layer to a k-th (k is an integer greater than 2) insulation layer, a second seed layer to an l-th (l is an integer greater than 2) seed layer, and a third single crystalline layer to an m-th (m is an integer greater than 3) single crystalline layer. The second to the k-th insulation layers may be substantially the same as the first insulation layer 132. The second to the m-th seed layers may be substantially the same as the first seed layer 134. The third to the m-th single crystalline layers may be substantially the same as the second single crystalline layer 138. Here, the second to the k-th insulation layers, the second to the l-th seed layers and the third to the m-th single crystalline layers may be alternately formed on the second single crystalline layer 138. For example, the second insulation layer, the second seed layer and the third single crystalline layer may be sequentially formed on the second single crystalline layer 138.

Figure 17:
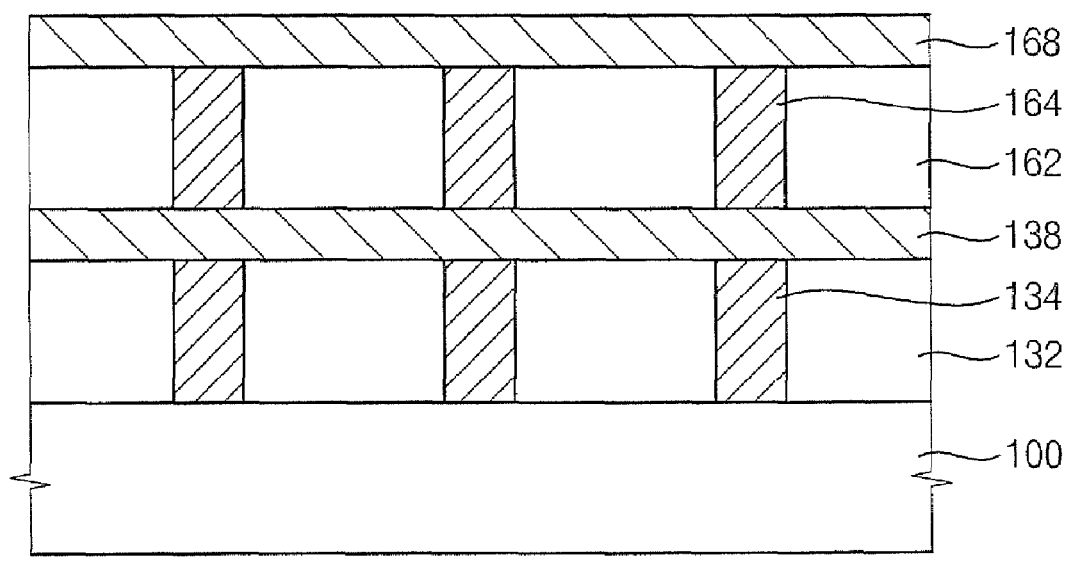
FIG. 17 is a cross-sectional diagram illustrating methods of manufacturing semiconductor devices in accordance with still further embodiments of the present invention.

FIG. 17 is a cross-sectional diagram illustrating methods of manufacturing semiconductor devices in accordance with further embodiments of the present invention. In FIG. 17, the semiconductor device includes a first single crystalline layer 100, a first insulation layer 132, a first seed layer 134 and a second single crystalline layer 138, which may be substantially the same as those of the semiconductor device described with reference to FIGS. 14A to 14D.

Referring to FIG. 17, the semiconductor device further includes a second insulation layer 162, a second seed layer 164 and a third single crystalline layer 168. The second insulation layer 162, the second seed layer 164 and the third single crystalline layer 168 may be formed by processes substantially the same as those described with reference to FIGS. 14A to 14D. The second insulation layer 162 may include a material substantially the same as that of the first insulation layer 132. Additionally, the second seed layer 164 and the third single crystalline layer 168 may include single crystalline material substantially the same as those of the first seed layer 134 and the second single crystalline layer 138, respectively.

In some example embodiments, the semiconductor device may further include a third insulation layer to a k-th (k is an integer greater than 3) insulation layer, a third seed layer to an l-th (l is an integer greater than 3) seed layer, and a fourth single crystalline layer to an m-th (m is an integer greater than 4) single crystalline layer. The third to the k-th insulation layers, the third to the l-th seed layers and the fourth to the m-th single crystalline layers may be alternately formed on the third single crystalline layer 168. For example, the third insulation layer, the third seed layer and the fourth single crystalline layer may be sequentially formed on the third single crystalline layer 168.

According to embodiments of the present invention, a single crystalline layer may include a high density of large-sized grains without generating a protrusion thereon. When a semiconductor device includes the single crystalline layer as a channel or an active region, the semiconductor device may have a high degree of integration and improved electrical characteristics.

The foregoing is illustrative of the present invention and is not to be construed as limiting thereof. Although a few embodiments of the present invention have been described, those skilled in the art will readily appreciate that many modifications are possible without materially departing from the novel teachings and advantages of the present invention. Accordingly, all such modifications are intended to be included within the scope of this invention as defined in the claims. The present invention is defined by the following claims, with equivalents of the claims to be included therein.

What is claimed is:

1. A method of forming a single crystalline semiconductor layer, the method comprising:
   forming a seed layer including a single crystalline semiconductor material;
   forming a non-single crystalline layer on the seed layer; and
   transforming at least a portion of the non-single crystalline layer into the single crystalline semiconductor layer by irradiating a laser beam onto the non-single crystalline layer, wherein an energy of the laser beam is sufficient to melt at least portions of the non-single crystalline layer, and wherein the laser beam is irradiated onto the non-single crystalline layer without generating a superimposedly irradiated region of the non-single crystalline layer.

2. The method of claim 1, wherein the transformation occurs during a phase change of the non-single crystalline layer.

3. The method of claim 2, wherein the seed layer acts as a seed for the crystallization of the non-single crystalline layer.

4. The method of claim 3, wherein the single crystalline semiconductor material in the seed layer comprises single crystalline silicon, single crystalline germanium or single crystalline silicon germanium.

5. The method of claim 3, wherein the non-single crystalline layer comprises an amorphous layer.

6. The method of claim 5, further comprising using a separate heating source to heat the seed layer and the amorphous layer during at least part of the time during which the laser beam is irradiated onto the amorphous layer.

7. The method of claim 6, wherein the seed layer and the amorphous layer are heated using the separate heating source at a temperature of about 200° C. to about 600° C. during at least part of the time that the laser bean irradiates onto the amorphous layer.

8. The method of claim 5, wherein the amorphous layer comprises amorphous silicon, amorphous germanium or amorphous silicon germanium.

9. The method of claim 8, wherein the single crystalline semiconductor layer comprises single crystalline silicon, single crystalline germanium or single crystalline silicon germanium.

10. The method of claim 5, wherein the laser beam is irradiated onto the amorphous layer by a step-and-repetition process.

11. The method of claim 10, wherein the laser beam is separately irradiated onto each of a plurality of regions of the amorphous layer.

12. A method of manufacturing a semiconductor device, comprising:
    forming a first single crystalline layer on a substrate;
    forming a first insulation layer having an opening on the first single crystalline layer;
    forming a first seed layer in the opening;
    forming an amorphous layer on the first seed layer and the first insulation layer; and
    forming a second single crystalline layer from at least a portion of the amorphous layer by irradiating a laser beam onto the amorphous layer using the first seed layer as a seed for a phase change of the amorphous layer, wherein an energy of the laser beam is sufficient to melt at least portions of the amorphous layer, and wherein the laser beam is irradiated onto the amorphous layer without generating a superimposedly irradiated region of the amorphous layer.

13. The method of claim 12, wherein the first insulation layer comprises silicon oxide and the first single crystalline layer comprises single crystalline silicon.

14. The method of claim 12, wherein the first seed layer comprises single crystalline silicon, single crystalline germanium or single crystalline silicon germanium.

15. The method of claim 12, further comprising using a separate heating source to heat the amorphous layer while irradiating the laser beam onto the amorphous layer.

16. The method of claim 15, wherein the amorphous layer is heated by the separate heating source at a temperature of about 200° C. to about 600° C.

17. The method of claim 12, wherein the amorphous layer comprises amorphous silicon, amorphous germanium or amorphous silicon germanium.

18. The method of claim 17, wherein the second single crystalline layer comprises single crystalline silicon, single crystalline germanium or single crystalline silicon germanium.

19. The method of claim 12, wherein the laser beam is irradiated onto the amorphous layer by a step-and-repetition process.

20. The method of claim 19, wherein the laser beam is separately irradiated onto each of a plurality of regions of the amorphous layer.

21. The method of claim 12, further comprising forming a semiconductor structure on the first single crystalline layer.

22. The method of claim 12, further comprising removing a portion of the first seed layer on the first insulation layer by a chemical mechanical polishing process.

23. The method of claim 12, further comprising:
forming a second insulation layer to a k-th (k is an integer greater than 2) insulation layer, wherein the second to the k-th insulation layers are substantially the same as the first insulation layer;
forming a second seed layer to an l-th (l is an integer greater than 2) seed layer, wherein the second to the l-th seed layers are substantially the same as the first seed layer; and
forming a third single crystalline layer to an m-th (m is an integer greater than 3) single crystalline layer, wherein the third to the m-th single crystalline layers are substantially the same as the second single crystalline layer.

24. The method of claim 23, wherein the second to the k-th insulation layers, the second to the l-th seed layers and the third to the m-th single crystalline layers are alternately formed on the second single crystalline layer.

* * * * *